United States Patent
Alur et al.

(10) Patent No.: US 10,741,947 B2
(45) Date of Patent: Aug. 11, 2020

(54) PLATED THROUGH HOLE SOCKETING COUPLED TO A SOLDER BALL TO ENGAGE WITH A PIN

(71) Applicant: Intel Corporation, Santa Clara, CA (US)

(72) Inventors: Amruthavalli Pallavi Alur, Tempe, AZ (US); Siddharth K. Alur, Chandler, AZ (US); Liwei Cheng, Chandler, AZ (US); Lauren A. Link, Mesa, AZ (US); Jonathan L. Rosch, Mesa, AZ (US); Sai Vadlamani, Chandler, AZ (US); Cheng Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/868,169

(22) Filed: Jan. 11, 2018

(65) Prior Publication Data

US 2019/0214751 A1    Jul. 11, 2019

(51) Int. Cl.
| | |
|---|---|
| *H01R 12/71* | (2011.01) |
| *H01R 43/16* | (2006.01) |
| *H01R 13/24* | (2006.01) |
| *H01R 12/70* | (2011.01) |
| *H05K 3/42* | (2006.01) |
| *H01R 12/58* | (2011.01) |
| *H01R 12/52* | (2011.01) |

(52) U.S. Cl.
CPC ......... *H01R 12/716* (2013.01); *H01R 12/585* (2013.01); *H01R 12/707* (2013.01); *H01R 13/24* (2013.01); *H01R 43/16* (2013.01); *H05K 3/42* (2013.01); *H01R 12/526* (2013.01)

(58) Field of Classification Search
CPC .... H01R 12/716; H01R 12/707; H01R 13/24; H01R 43/16; H01R 12/526; H01R 12/585; H01R 9/096; H01R 43/0256; H05K 3/42
USPC ...................... 439/83, 65, 66, 862, 873, 876
See application file for complete search history.

(56) References Cited

U.S. PATENT DOCUMENTS

| | | | | |
|---|---|---|---|---|
| 5,702,255 A | * | 12/1997 | Murphy | H01R 13/2478 439/71 |
| 6,086,386 A | * | 7/2000 | Fjelstad | H05K 7/1061 439/70 |
| 6,259,039 B1 | * | 7/2001 | Chroneos, Jr. | H01R 43/0256 174/260 |
| 6,415,504 B1 | * | 7/2002 | Matsuda | H05K 3/225 174/251 |
| 7,128,579 B1 | * | 10/2006 | Brodsky | H01R 12/523 439/66 |

(Continued)

*Primary Examiner* — Travis S Chambers
(74) *Attorney, Agent, or Firm* — Schwegman Lundberg & Woessner, P.A.

(57) ABSTRACT

An electronic interconnect may include a substrate. The substrate may include a passageway in the substrate. The passageway may extend from a first surface of the substrate toward a second surface of the substrate. The passageway may be closed at an end of the passageway. The electronic interconnect may include a plated through hole socket coupled to the passageway. The electronic interconnect may include a contact. The contact may include a pin. The pin may be configured to engage with the plated through hole socket. The electronic interconnect may include a solder ball. The solder ball may be coupled to the plated through hole socket.

23 Claims, 7 Drawing Sheets

(56) References Cited

U.S. PATENT DOCUMENTS

| | | | | |
|---|---|---|---|---|
| 7,438,581 B1* | 10/2008 | Jeon | ........................ | H05K 1/141 |
| | | | | 439/101 |
| 7,690,925 B2* | 4/2010 | Goodman | ............ | H05K 7/1061 |
| | | | | 361/813 |
| 8,118,611 B2* | 2/2012 | Jeon | .................... | H01R 12/523 |
| | | | | 439/511 |
| 8,167,644 B2* | 5/2012 | Mason | ................... | H01R 12/57 |
| | | | | 29/847 |
| 8,969,734 B2* | 3/2015 | Murphy | ............... | B23K 1/0016 |
| | | | | 174/260 |
| 9,039,448 B2* | 5/2015 | Mason | ............. | H01R 13/65807 |
| | | | | 439/607.09 |
| 10,079,443 B2* | 9/2018 | Costello | ............. | H01R 13/2442 |
| 2007/0298657 A1* | 12/2007 | Ju | ........................ | H01R 12/716 |
| | | | | 439/607.11 |
| 2008/0052904 A1* | 3/2008 | Schneider | ............. | H01L 21/486 |
| | | | | 29/846 |
| 2011/0070750 A1* | 3/2011 | Reisinger | ............ | H01R 12/7082 |
| | | | | 439/66 |
| 2013/0244490 A1* | 9/2013 | Rathburn | ............... | H05K 3/326 |
| | | | | 439/628 |
| 2018/0287276 A1* | 10/2018 | Taguchi | .................. | H01R 12/57 |
| 2018/0287279 A1* | 10/2018 | Taguchi | ............. | H01R 13/2442 |
| 2019/0148859 A1* | 5/2019 | Mason | ................. | H01R 12/585 |
| | | | | 439/68 |
| 2019/0148860 A1* | 5/2019 | Mason | ................. | H01R 12/585 |
| | | | | 439/68 |
| 2019/0150311 A1* | 5/2019 | Mason | ................. | H01R 12/585 |
| | | | | 439/55 |

* cited by examiner

PLATED THROUGH HOLE SOCKETING COUPLED TO A SOLDER BALL TO ENGAGE WITH A PIN

BACKGROUND

Openings may be formed in substrates. The openings may be plated with a conductive material to create a plated through hole in the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include configuring a plated through hole to include a socket. The present inventors have recognized, among other things, that an additional problem to be solved may include configuring a pin to engage with a plated through hole socket. The present inventors have recognized, among other things, that a further problem to be solved may include configuring a plated through hole socket that is coupled to a solder ball to engage with a pin. The present subject matter may help provide a solution to this problem, such as by providing an electronic interconnect.

The electronic interconnect may include a substrate. The substrate may include a passageway in the substrate. The passageway may extend from a first surface of the substrate toward a second surface of the substrate. The passageway may be closed at an end of the passageway. The electronic interconnect may include a plated through hole socket coupled to the passageway. The electronic interconnect may include a contact. The contact may include a pin. The pin may be configured to engage with the plated through hole socket. The electronic interconnect may include a solder ball. The solder ball may be coupled to the plated through hole socket.

The electronic interconnect may allow for a direct conversion of a pin grid array to a ball grid array. The electronic interconnect may obviate the need for additional electrical routing between the contact and the solder ball, such as by providing the plated through hole socket. The plated through hole socket may be configured to withstand the power requirements of electronic devices, and thereby obviate the need for additional electrical routing.

This overview is intended to provide an overview of subject matter of the present patent application. It is not intended to provide an exclusive or exhaustive explanation of the invention.

Figure 1:
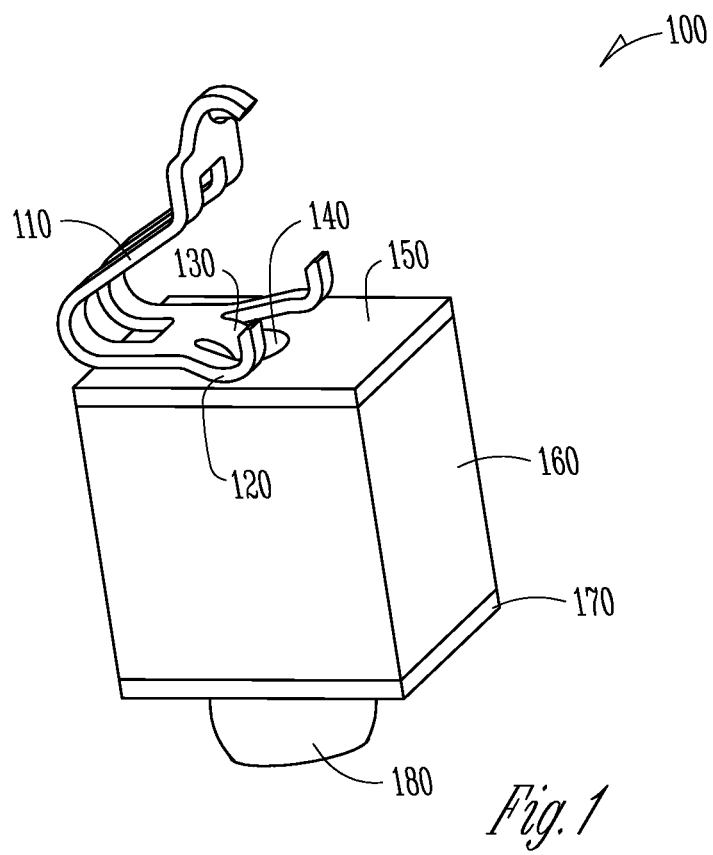
FIG. 1 illustrates an example of a first electronic interconnect.

FIG. 1 illustrates an example of a first electronic interconnect 100. The first electronic interconnect may include a contact 110. The contact 110 may include a leg 120. The contact 110 may include a plurality of legs. The plurality of legs may include the leg 120. The leg 120 may be configured to increase the mechanical strength of the contact 120, such as by providing structural support to the contact 110 by engaging with a surface. The contact 110 may include a pin 130. The pin may include one or more prongs. The one or more prongs (e.g., the prong 240 of FIG. 2) may be configured to deflect in response to an applied force. The pin 130 may extend in a direction substantially perpendicular to the leg 120. The pin 130 may be positioned between the plurality of legs.

The first electronic interconnect 100 may include a substrate 160. The substrate 160 may have a thickness that ranges from values including, but not limited to, approximately 300 micrometers to 400 micrometers. A first dielectric layer 150 may be coupled to the substrate 160. A second dielectric layer 170 may be coupled to the substrate 160. The first dielectric layer 150 may be coupled to the substrate 160 at a first surface of the substrate 160. The second dielectric layer 170 may be coupled to the substrate 160 at a second surface of the substrate 160. The first surface of the substrate 160 may be opposite the second surface of the substrate 160.

The first electronic interconnect 100 may include a socket 140. The socket 140 may be configured to engage with the pin 130. Similarly, the pin 130 may be configured to engage with the socket 140. The pin 130 may extend into the socket 140. The socket 140 may be coupled to the substrate 160. The socket 140 may be coupled to the first dielectric layer 150. The socket 140 may be coupled to the second dielectric layer 170. The first electronic interconnect 100 may include a solder ball 180. The solder ball 180 may be coupled to the socket 140.

Figure 2:
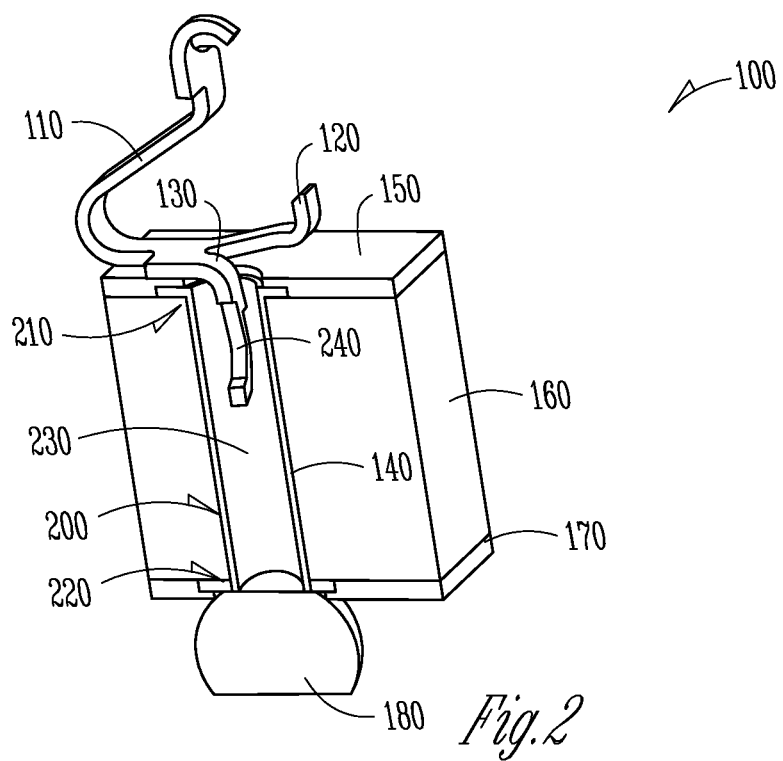
FIG. 2 illustrates a cross sectional view of the first interconnect.

FIG. 2 illustrates a cross-sectional view of the first electronic interconnect 100. The first electronic interconnect 100 may include a passageway 200 formed in the substrate 160. The passageway 200 may be formed in the first dielectric layer 150. The passageway 200 may be formed in the second dielectric layer 170. A cross section of the passageway 200 may be circular, square, rectangular, other geometric shapes, or the like.

The first electronic interconnect 100 may include the socket 140. The socket 140 may be coupled to the passageway 200 in the substrate 160. The socket 140 may be coupled to a wall (e.g., the wall 400 shown in FIG. 4) of the passageway 200 in the substrate 160. The socket 140 may be plated to the wall of the passageway 200 in the substrate 160. The socket 140 may be coupled to the first dielectric layer 150. The socket 140 may be coupled to the second dielectric layer 170. The socket 140 may include a first socket end 210. The socket 140 may include a second socket end 220.

The socket 140 may include a socket opening 230. The socket opening 230 may extend from the first socket end 210 toward the second socket end 220. The socket opening may be open at the first socket end 210 and closed at the second socket end 220. Closing the second socket end 220 may close an end of the passageway 200 in the substrate 160. In some examples, the socket opening 230 may have a depth in a range of 200 micrometers to 400 micrometers.

The socket opening 230 may be configured to receive the pin 130 of the contact 110. The pin 130 may engage with a wall of the socket opening 230. The engagement of the pin 130 with the wall of the socket opening 230 may couple the pin 130 with the socket 140. The engagement of the pin 130 with the wall of the socket opening 230 may establish electrical communication between the contact 110 and the socket 140.

The pin 140 may be biased toward the socket 140, such as the wall of the socket 140. The prong 240 may be configured to be biased toward the wall of the socket 140 when the pin 130 is engaged with the socket 140. The elasticity, or Young's Modulus, of the prong 240 (or the pin 130) may bias the prong 240 externally toward the wall of the socket opening 230.

In an example, the pin 130 includes a pair of the prongs, including the prong 240. The pair of prongs may have an outside dimension that is greater than an inside dimension of the socket opening 230. The pair of prongs may engage with the socket opening 230 and deflect inward. The deflection of the prongs may allow for the prongs to translate into the socket opening 230. The elasticity of the pair of prongs may bias the pair of prongs outward such that the pair of prongs engage with the wall of the socket opening 230. The engagement of the pair of prongs with the wall of the socket opening 230 may couple the contact 110 with the socket 140.

As shown in FIG. 2, the leg 120 may be positioned proximate the passageway 200. The leg 120 may be positioned in a region surrounding the passageway 200. The leg 120 may be coupled to the first dielectric layer 150. The leg 120 may be soldered to an electrical pad. The electrical pad may be in electrical communication with the socket 140, such as through a trace. The contact 110 may be positioned on a first side of the substrate. The coupling of the leg 120 to the first electronic interconnect 100 may add mechanical stability to the contact 110.

Referring again to FIG. 2, the first electronic interconnect 100 may include the solder ball 180. The solder ball 180 may be coupled to the socket 140. The solder ball may be positioned on a second side of the substrate. The first side of the substrate maybe opposite the second side of the substrate. The solder ball 180 may close an end of the passageway 200 in the substrate 160. The solder ball 180 may form a direct interface with the second dielectric layer 170.

The coupling of the socket 140 to the passageway 200 in the substrate 160 may allow for the electrical communication between the contact 110 and the solder ball 180. The socket 140 may be configured to provide sufficient conductive material to withstand the electrical power requirements of electronic devices (e.g., a semiconductor die, a processor, graphics processing units, memory, modems, or the like) without additional electrical routing between the contact 110 and the solder ball 180.

In an example, the first electronic interconnect 100 may be configured to allow for a direct conversion of a pin grid array to a ball grid array. The direct conversion of the pin grid array to the ball grid array may be accomplished without requiring additional electrical routing (e.g., routing layers, traces, or the like) between the pin grid array and the ball grid array.

The first electronic interconnect may include a solder material. The socket opening 230 may include the solder material. The solder material may be placed (e.g., dispensed) into the socket opening 230. The solder material may form a direct interface with the socket opening 230. The solder material may form a direct interface with the pin 130. The solder material may include solder paste, copper paste, conductive fillers, or the like. The solder material may be cured. The solder material may improve the mechanical stability of the pin 130 with the socket 140. The solder material may improve the electrical performance of the first electronic interconnect 100, such as by improving conductivity between the contact 110 and the socket 140.

Figure 3:
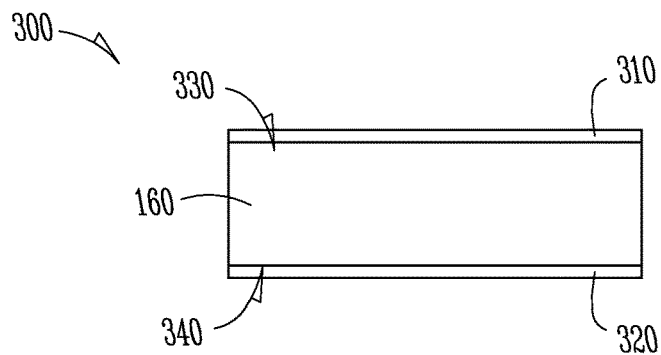
FIG. 3 illustrates an example of a second electronic interconnect during a manufacturing operation.

FIG. 3 illustrates an example of a second electronic interconnect 300 during a manufacturing operation. In describing the second electronic interconnect 300, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with reference to the second electronic interconnect 300 include, but are not limited to, the corresponding numbered elements provided herein and other corresponding elements described herein (both numbered and unnumbered) as well as their equivalents.

The second electronic interconnect 300 may include the substrate 160. The substrate 160 may include a dielectric material. The substrate 160 may include a first substrate surface 330. The substrate 160 may include a second substrate surface 340. The second substrate surface 340 may be positioned opposite the first substrate surface 330.

The second electronic interconnect 300 may include a first conductive layer 310. The first conductive layer 310 may be coupled to the first substrate surface 330. The second electronic interconnect 300 may include a second conductive layer 320. The second conductive layer 320 may be coupled to the second substrate surface 340.

Figure 4:
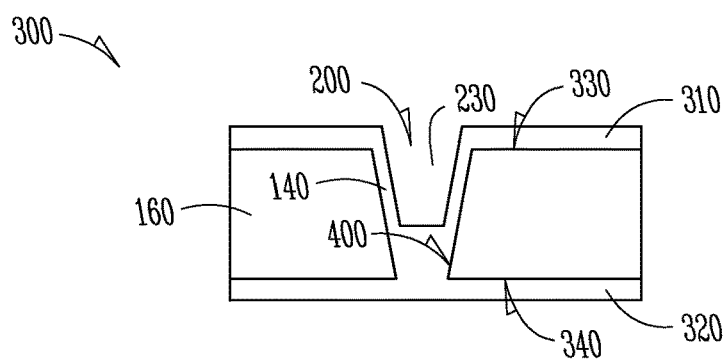
FIG. 4 illustrates an example of the second electronic interconnect during an additional manufacturing operation.

FIG. 4 illustrates an example of the second electronic interconnect 300 during an additional manufacturing operation. A portion of the first conductive layer 310 may be removed (e.g., mechanically, chemically, with a laser, or the like). A portion of the substrate 160 may be removed. The passageway 200 may be created by (e.g., formed by) the removal of the portion of the first conductive layer 310 and the portion of the substrate 160. The passageway 200 may be cleaned, such as by desmearing to remove debris resulting from the removal process. A wall 400 of the passageway 200 may be tapered. The wall 400 may be tapered as a result of the removal process.

In an example, a laser is utilized to remove (e.g., ablate) material from a portion of the first conductive layer 310. The laser may remove the portion of the first conductive layer 310 and interact with the first substrate surface (shown in FIG. 3) of the substrate 160. The laser may remove a portion of the substrate 160, thereby creating the passageway 200. The laser removal process may cause the tapering of the passageway 200. The energy supplied to the laser may be decreased (in comparison to the energy supplied to the laser when removing the portion of the first conductive layer 310) when removing the portion of the substrate 160.

The second conductive layer 320 may close an end of the passageway 200. The laser may remove the portion of the substrate 160 and interact with the second conductive layer 320. The second conductive layer 320 may be utilized as a stop and prevent the laser from removing additional material. The second conductive layer 320 may resist, or withstand, the laser because the energy supplied to the laser may have been reduced when removing the portion of the substrate 160. The interaction of the laser with the second conductive layer 320 may be detectible through inspection. The laser may be deenergized or reflected when it interacts with the second conductive layer 320.

Referring again to FIG. 4, the socket 140 may be coupled to the passageway 200. The socket 140 may include a conductive material (e.g., copper; aluminum; nickel; alloys including copper, aluminum, or nickel; or the like). The conductive material may be coupled to (e.g., deposited on, plated on, or the like) the first conductive layer 310, the substrate 160, and the second conductive layer 320. The conductive material may be coupled to the wall 400 of the passageway 200. Coupling of the conductive material may include depositing the conductive material by utilizing a plating process, such as conformal plating. The coupling of the conductive material may create the socket 140. The socket 140 may be configured to include the socket opening 230.

The conductive material may be coupled with the substrate 160 and the second conductive layer 320 at the interface of the second substrate surface 340 and the second conductive layer 320. The coupling of the conductive material to the first conductive layer 310 and the second conductive layer 320 may increase the thickness of the first conductive layer 310 and the second conductive layer 320. The increase of thickness may be detectable by inspection, such as by observable differences in grain structures. Stated another way, the plating process is detectable. Electroplating or chemical plating provides a distinctive signature, for example in the first conductive layer 310 (e.g., in comparison to mechanical drilling).

Figure 5:
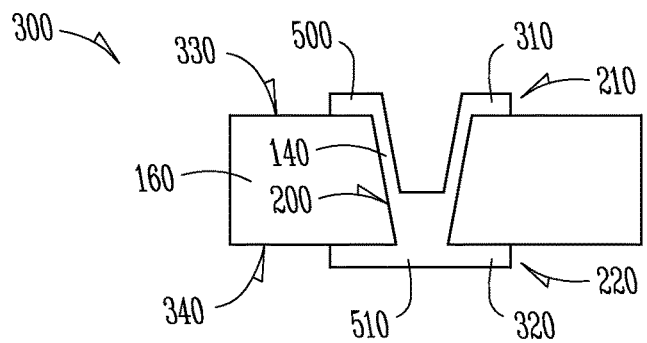
FIG. 5 illustrates an example of the second electronic interconnect during a further manufacturing operation.

FIG. 5 illustrates an example of the second electronic interconnect 300 during a further manufacturing operation. A portion of the first conductive layer 310 and a portion of the second conductive layer 320 may be removed from the first electronic interconnect 300. The portion of the first conductive layer 310 and the portion of the second conductive layer 320 may be patterned with, and coupled to, a material resistant to chemical etching. The areas of the first conductive layer 310 and the second conductive layer 320 outside of the etch-resistant material may be removed, such as by chemical etching. The removal of the areas of the first conductive layer 310 may create the first socket end 210. The removal of the areas of the second conductive layer 320 may create the second socket end 220.

The socket 140 may include a socket flange 500. The socket flange 500 may be included in the socket first end 310. The socket flange 500 may include the first conductive layer 310. The socket flange 500 may be created by the patterning of the etch-resistant material. The socket flange 500 may be coupled with the first substrate surface 330. The socket flange 500 may extend beyond (e.g., directly adjacent to, positioned around, or the like) the passageway 200 of the substrate 160. The socket flange 500 may improve the mechanical stability to the socket 140.

The socket 140 may include a socket pad 510. The socket pad 510 may be included in the socket second end 220. The socket pad 510 may be coupled with the second substrate surface 340. The socket pad 510 may be configured to couple with the solder ball 180 (shown in FIGS. 1 and 2). The socket pad 510 may improve the mechanical stability to the socket 140.

Figure 6:
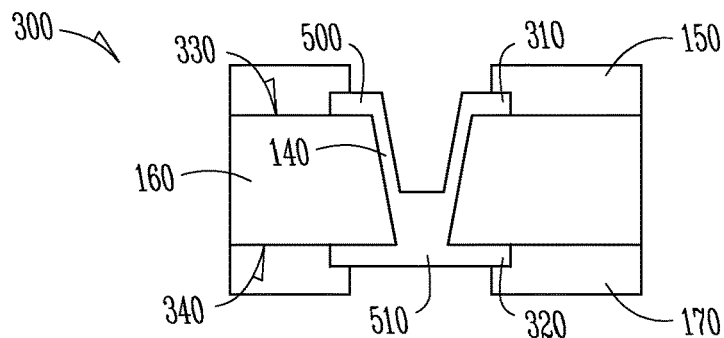
FIG. 6 illustrates an example of the second electronic interconnect during yet another manufacturing operation.

FIG. 6 illustrates an example of the second electronic interconnect 300 during yet another manufacturing operation. The first dielectric layer 150 may be coupled to (e.g., deposited, molded, or the like) the first substrate surface 330. The first dielectric layer 150 may be coupled to the socket 140. The first dielectric layer 150 may form a direct interface with the socket flange 500. The second dielectric layer 170 may be coupled to the second substrate surface 340. The second dielectric layer 170 may be coupled to the socket 140. The second dielectric layer 170 may form a direct interface with the socket pad 500. The first dielectric layer 150 and the second dielectric layer 170 may include the same material as the substrate 160. A seam may be detectable at the interface of the first dielectric layer 150 and the second dielectric layer 170 with the substrate 160. The first dielectric layer 150 and the second dielectric layer 170 may improve the mechanical stability of the second electronic interconnect 300, such as by engaging with the socket flange 500 and the socket pad 510.

Figure 7:
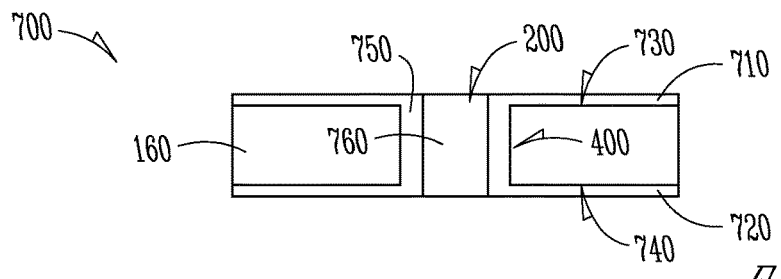
FIG. 7 illustrates an example of a third electronic interconnect during a manufacturing operation.

FIG. 7 illustrates an example of a third electronic interconnect 700 during a manufacturing operation. In describing the third electronic interconnect 700, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the third electronic interconnect 700 include, but are not limited to, the corresponding numbered elements provided herein and other corresponding elements described herein (both numbered and unnumbered) as well as their equivalents.

The third electronic interconnect 700 may include the substrate 160. The third electronic interconnect 700 may include a first conductive layer 710. The first conductive layer 710 may be coupled to a first substrate surface 730 of the substrate 160. The third electronic interconnect 700 may include a second conductive layer 720. The second conductive layer 720 may be coupled a second substrate surface 740 of to the substrate 160.

The passageway 200 may be formed in the first conductive layer 710, the substrate 160, and the second conductive layer 720. A conductive liner 750 may be coupled to the wall 400 of the passageway 200. The conductive liner 750 may electrically interconnect the first conductive layer 710 with the second conductive layer 720. The passageway 200 may include a cavity between the conductive liner 750.

A socket core 760 may be coupled with the conductive liner 750. The socket core 760 may be coupled with (e.g., inserted into) the cavity. The socket core 760 may fill the cavity, and thereby close both ends of the passageway 200. The socket core 760 may be coplanar with the first conductive layer 710 and the second conductive layer 720. The socket core 760 may be configured to include a dielectric material. Configuring the socket core 760 to include the dielectric material may improve the mechanical stability (e.g., resilience) of the third electronic interconnect 700. The socket core 760 may be configured to include a conductive filler. The conductive filler may include solder paste, copper paste, or the like. Configuring the socket core to include a conductive filler may improve the electrical properties (e.g., conductivity) of the third electronic interconnect 700.

Figure 8:
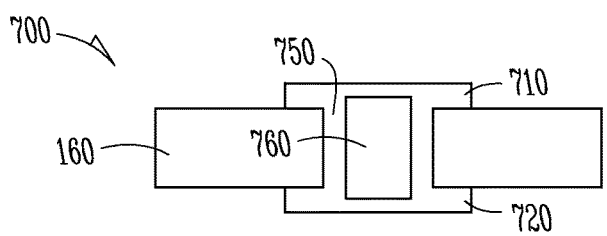
FIG. 8 illustrates an example of the third electronic interconnect during an additional manufacturing operation.

FIG. 8 illustrates an example of the third electronic interconnect 700 during an additional manufacturing operation. A conductive material may be coupled to (e.g., deposited, plated, or the like) the first conductive layer 710 and the socket core 760. The conductive material may be coupled to the second conductive layer 720 and the socket core 760. The conductive material may increase the thickness of the first conductive layer 710 and the second conductive layer 720. The increase of thickness may be detectable by inspection, such as by observable differences in grain structures.

A portion of the first conductive layer 710 and a portion of the second conductive layer 720 may be removed from the third electronic interconnect 700. The portion of the first conductive layer 710 and the portion of the second conductive layer 720 may be patterned with, and coupled to, a material resistant to chemical etching. The areas of the first conductive layer 710 and the second conductive layer 720 outside of the etch-resistant material may be removed, such as by chemical etching.

Figure 9:
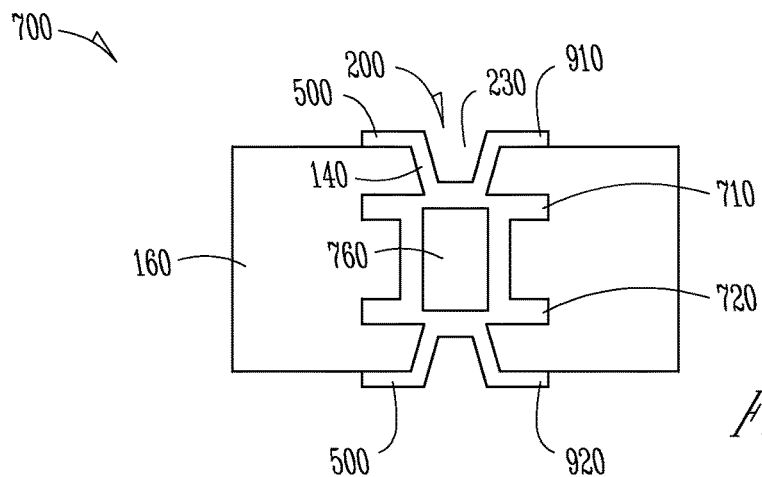
FIG. 9 illustrates an example of the third electronic interconnect during a further manufacturing operation.

FIG. 9 illustrates an example of the third electronic interconnect 700 during a further manufacturing operation. The first conductive layer 710 and the substrate 160 may be enclosed in a dielectric material, thereby expanding the substrate 160. The second conductive layer 720 and the substrate 160 may be enclosed in a dielectric material, thereby expanding the substrate 160.

As described herein, the passageway 200 may be formed in the substrate 160. The third electronic interconnect 700 may include a third conductive layer 910. The third electronic interconnect 700 may include a fourth conductive layer 920. The passageway 200 may expose a portion of the first conductive layer 710. The third conductive layer 910 may be coupled to the first conductive layer 710 and the passageway 200. The passageway 200 may expose a portion of the second conductive layer 720. The fourth conductive layer may be coupled to the second conductive layer 720 and the passageway 200.

The third electronic interconnect 700 may one or more sockets. The one or more sockets may include the socket 140. The socket 140 may be coupled to the passageway 200. The third conductive layer 910 may be configured to include the socket 140. The fourth conductive layer 920 may be configured to include the socket 140. The socket 140 may include the socket flange 500. The socket flange 500 may be coextensive with (e.g., having the same width as) the first conductive layer 710 and the second conductive layer 720.

Figure 10:
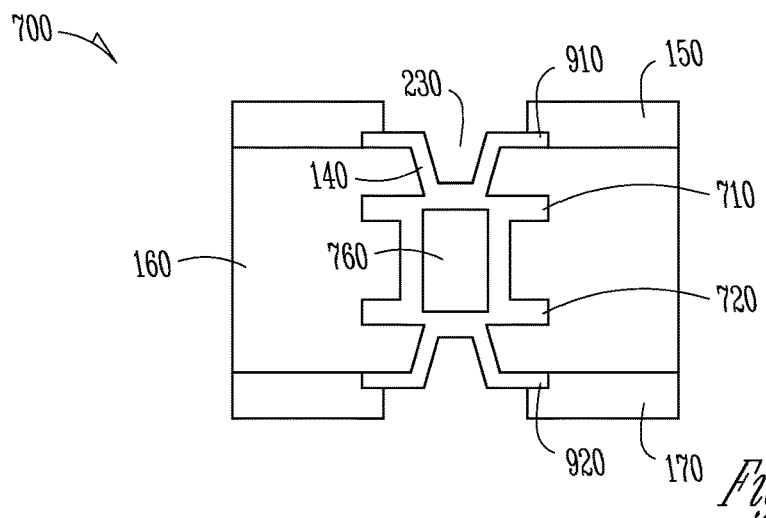
FIG. 10 illustrates an example of the third electronic interconnect during yet another manufacturing operation.

FIG. 10 illustrates an example of the third electronic interconnect during yet another manufacturing operation. The first dielectric layer 150 may be coupled to the substrate 160. The first dielectric layer 150 may be coupled to the third conductive layer 910. The first dielectric layer 150 may form a direct interface with the socket flange 500. The second dielectric layer 170 may be coupled to substrate 160. The second dielectric layer 170 may be coupled to the fourth conductive layer 920. The second dielectric layer 170 may form a direct interface with the socket flange 500.

The third electronic interconnect 700 may be classified as a 0-4-0 core. The first conductive layer 710 and the second conductive layer 720 may be configured to route electrical signals to and from the third electronic interconnect 700. The third routing layer 910 may include the socket 140. The socket 140 may be configured to engage with the pin 130 (shown in FIGS. 1 and 2) of the contact 110 (shown in FIGS. 1 and 2). The solder ball 180 (shown in FIGS. 1 and 2) may be coupled to the fourth conductive layer 920.

Figure 11:
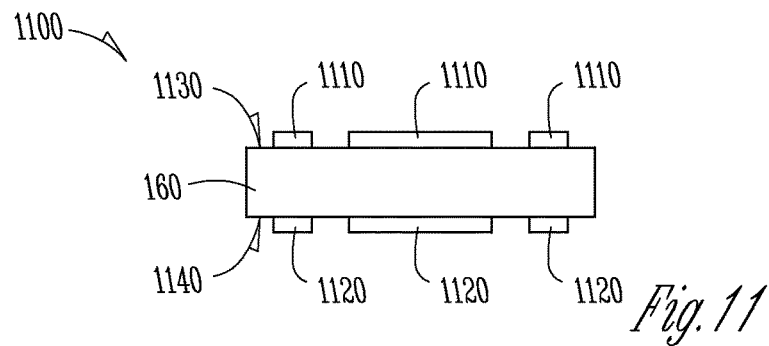
FIG. 11 illustrates an example of a fourth electronic interconnect during a manufacturing operation.

FIG. 11 illustrates an example of a fourth electronic interconnect 1100 during a manufacturing operation. In describing the fourth electronic interconnect 1100, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the fourth electronic interconnect 1100 include, but are not limited to, the corresponding numbered elements provided herein and other corresponding elements described herein (both numbered and unnumbered) as well as their equivalents.

The fourth electronic interconnect 1100 may include the substrate 160. The fourth electronic interconnect 1100 may include a first conductive layer 1110. The first conductive layer 1110 may be segmented into isolated sections. The fourth electronic interconnect 1100 may include a second conductive layer 1120. The second conductive layer 1120 may be segmented into isolated sections.

Figure 12:
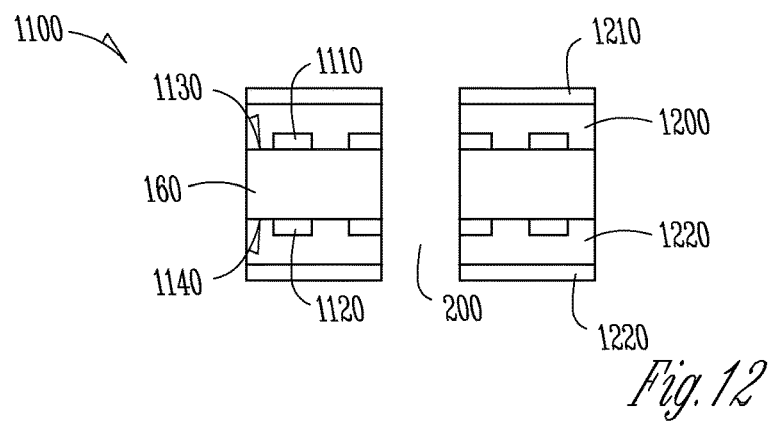
FIG. 12 illustrates an example of the fourth electronic interconnect during an additional manufacturing operation.

FIG. 12 illustrates an example of the fourth electronic interconnect 1100 during an additional manufacturing operation. The fourth electronic interconnect 1100 may include a first dielectric layer 1200. The first dielectric layer 1200 may be coupled to (e.g., enclose) the first conductive layer 1110 and the substrate 160. The first dielectric layer 1200 may be coupled to the second conductive layer 1120 and the substrate 160. A seam may be detectable at the interface of the first dielectric layer 1200 and the substrate 160.

A third conductive layer 1210 may be coupled to the first dielectric layer 1200. A fourth conductive layer 1220 may be coupled to the first dielectric layer 1200. The passageway 200 may be formed in the fourth electronic interconnect 1100, such as by mechanical drilling or laser ablation. The passageway 200 may extend through the third conductive layer 1210, the first dielectric layer 1200, the first conductive layer 1110, the substrate 160, the second conductive layer 1120, and the fourth conductive layer 1220.

Figure 13:
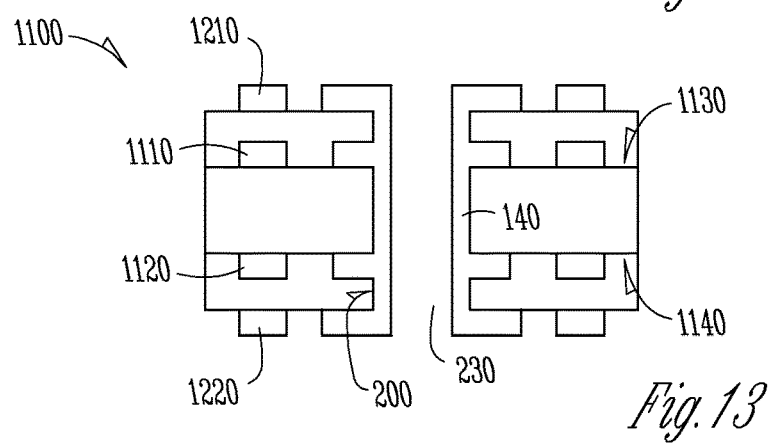
FIG. 13 illustrates an example of the fourth electronic interconnect during a further manufacturing operation.

FIG. 13 illustrates an example of the fourth electronic interconnect 1100 during a further manufacturing operation. The fourth electronic interconnect 1100 may include the socket 140. The socket 140 may include the first conductive layer 1110, the second conductive layer 1120, the third conductive layer 1210, and the fourth conductive layer 1220. As described herein, the socket 140 may be coupled to the passageway 200. The coupling of the socket 140 to the passageway 200 may increase the thickness of the third conductive layer 1210 and the fourth conductive layer 320. The increase of thickness may be detectable by inspection, such as by observable differences in grain structures. The fourth electronic interconnect 1100 may include the socket flange 500. The third conductive layer 1210 may include the socket flange 500. The fourth conductive layer 1220 may include the socket flange 500.

Figure 14:
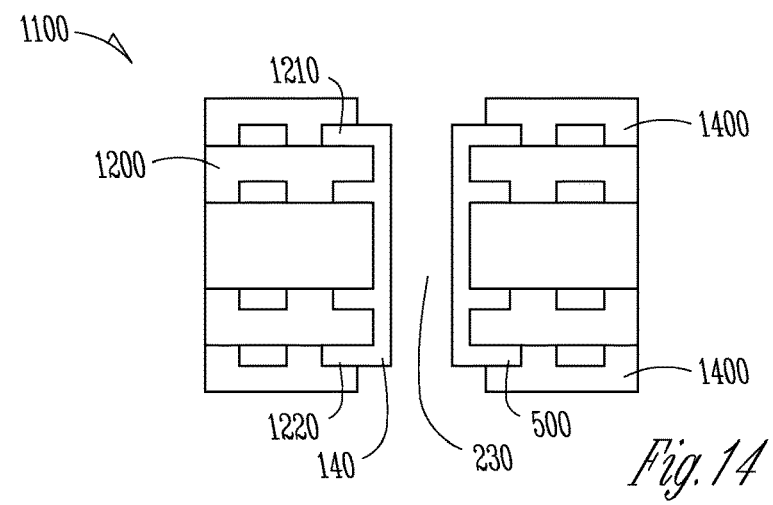
FIG. 14 illustrates an example of the fourth electronic interconnect during yet another manufacturing operation.

FIG. 14 illustrates an example of the fourth electronic interconnect 1100 during yet another manufacturing operation. The fourth electronic interconnect 1100 may include a second dielectric layer 1400. The second dielectric layer 1400 may be coupled to the third conductive layer 1210 and the first dielectric layer 1400. The second dielectric layer 1400 may be coupled to the fourth conductive layer 1220 and the first dielectric layer 1400. A seam may be detectable at the interface of the second dielectric layer 1400 and the first dielectric layer 1200. An inside dimension of the second dielectric layer 1400 may be greater than an inside dimension of the socket opening 230. The first dielectric layer 1200 and the second dielectric layer 1400 may overlap a portion of the socket 140, such as the socket flange 500.

The socket 140 may include the socket opening 230. The socket opening 230 may include a first end extending from the third interconnect layer 1210 to a second end at the fourth interconnect layer 1220. The fourth electronic interconnect 1100 may include the solder ball 180 (shown in FIGS. 1 and 2). The second end of the socket opening 230 may be coupled to the solder ball 180. The solder ball 180 may close the second end of the socket opening 230. The solder ball 180 may close the passageway 200. The first end of the socket opening 230 may be configured to receive the pin 130 (shown in FIGS. 1 and 2) of the contact 110 (shown in FIGS. 1 and 2). The first end of the socket opening 230 may be left open such that the pin 130 may translate into the socket opening 230 and engage with the socket 140.

Figure 15:
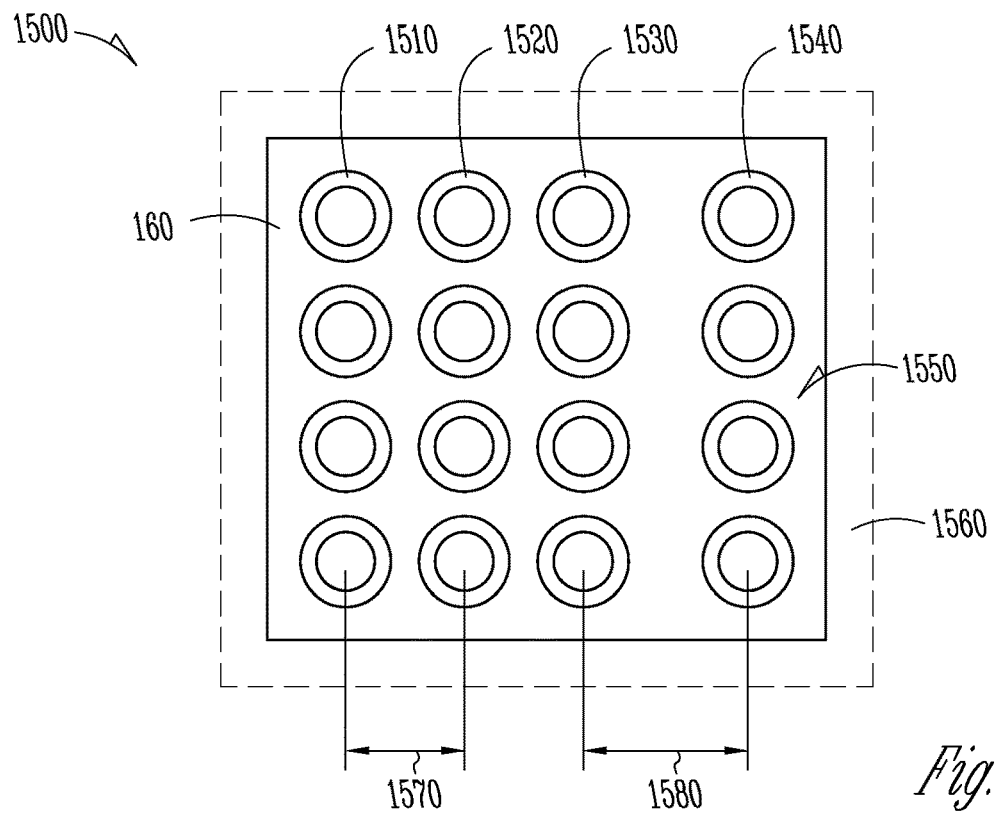
FIG. 15 illustrates an example of a first side of a first electronic system.

FIG. 15 illustrates an example of a first side of a first electronic system 1500. In describing the first electronic system 1500, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the first electronic system 1500 include, but are not limited to, the corresponding numbered elements provided herein and other corresponding elements described herein (both numbered and unnumbered) as well as their equivalents.

The first electronic system 1500 may include one or more of the first electronic interconnect 100, the second electronic interconnect 300, the third electronic interconnect 700, and/or the fourth electronic interconnect 1100. The first electronic system 1500 may include the substrate 160. The first electronic system 1500 may include a first socket 1510 (e.g., the socket 140 of FIGS. 1-2, 4-6, 9-10, and 13-14). The first electronic system 1500 may include a second socket 1520. The first electronic system 1500 may include a third socket 1530. The first electronic system 1500 may include a fourth socket 1540. The first socket 1510 the second socket 1520, the third socket 1530, and the fourth socket 1540 may be included in the plurality of sockets 1550.

The first socket 1510 may be spaced from the second socket 1520 at a first pitch 1570. The first pitch 1570 spacing may be one millimeter or less than one millimeter (e.g., 1000 micrometers, 800 micrometers, 600 micrometers, 400 micrometers, or the like). The first pitch 1570 spacing may be greater than one millimeter. The first socket 1510 may be spaced from the second socket 1520 at a second pitch. The second pitch may be greater than the first pitch 1560. The third socket 1530 may be spaced from the fourth socket 1540 at a third pitch 1580. The third pitch 1580 may be greater than the first pitch 1570. The third pitch 1580 may be greater than the second pitch.

The plurality of sockets 1550 may be arranged in an array (e.g., grid). In an example, the first electronic system includes a pin grid array. The pin grid array may include the plurality of sockets 1550. Each of the plurality of sockets 1550 may be configured to engage with a pin (e.g., the pin 130 of FIGS. 1 and 2) of a contact (e.g., the contact 110 of FIGS. 1 and 2). The first electronic system 1500 may include a plurality of contacts. The plurality of contacts may include a first contact and a second contact. The first contact and the second contact may be coupled to an integrated circuit 1560 (e.g., a semiconductor die, a processor, or the like).

Figure 16:
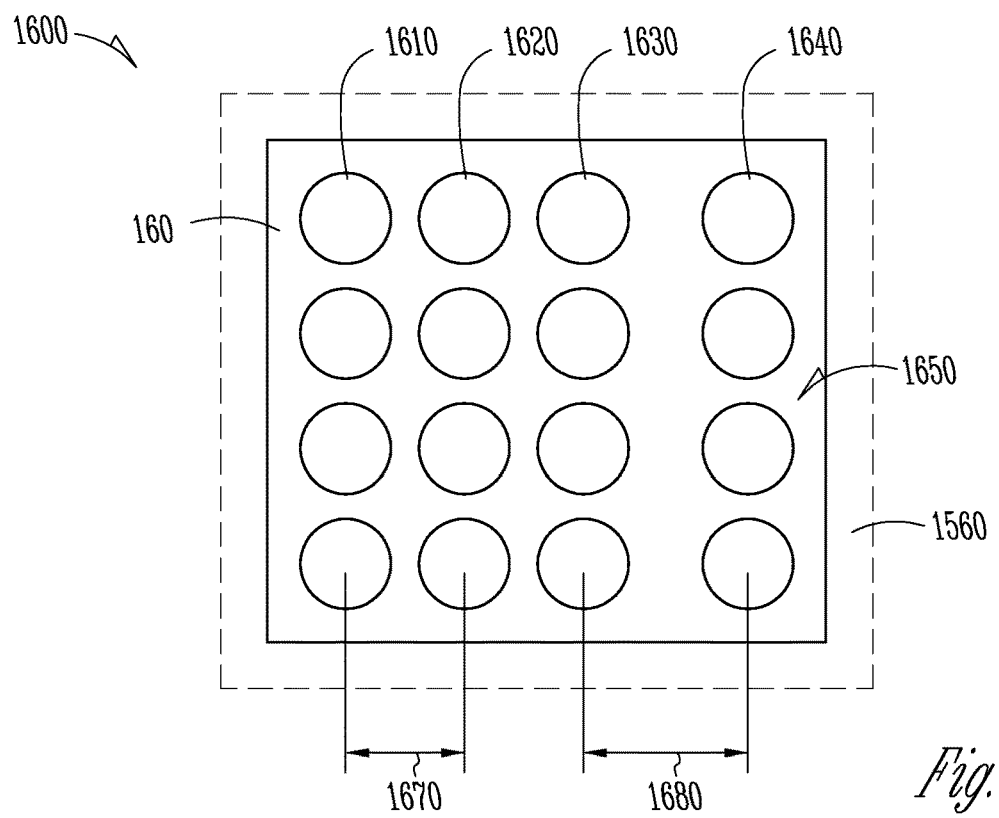
FIG. 16 illustrates a view of an example of a second side of the first electronic system.

FIG. 16 illustrates a view of an example of a second side of the first electronic system 1500. The first electronic system 1500 may include a first solder ball 1610. The first solder ball 1610 may be coupled to the first socket 1510. The first electronic system 1500 may include a second solder ball 1620. The second solder ball 1620 may be coupled to the second socket 1520. The first electronic system 1500 may include a third solder ball 1630. The third solder ball 1630 may be coupled to the third socket 1530. The first electronic system 1500 may include a fourth solder ball 1640. The fourth solder ball 1640 may be coupled to the fourth socket 1540. The first solder ball 1610, the second solder ball 1620, the third solder ball 1630, and the fourth solder ball 1640 may be included in a plurality of solder balls 1650.

The first solder ball 1610 may be spaced from the second solder ball 1620 at a fourth pitch 1660. The fourth pitch 1660 may equal the first pitch 1560. The first solder ball 1610 may be spaced from the second solder ball 1620 at the second pitch. The third solder ball 1630 may be spaced from the fourth solder ball 1640 at a fifth pitch 1560. The fifth pitch 1670 may be equal to the third pitch 1570. The plurality of solder balls 1650 may be arranged in the array. In an example, the first electronic system 1500 includes a ball grid array. The ball grid array may include the plurality of solder balls 1650.

Figure 17:
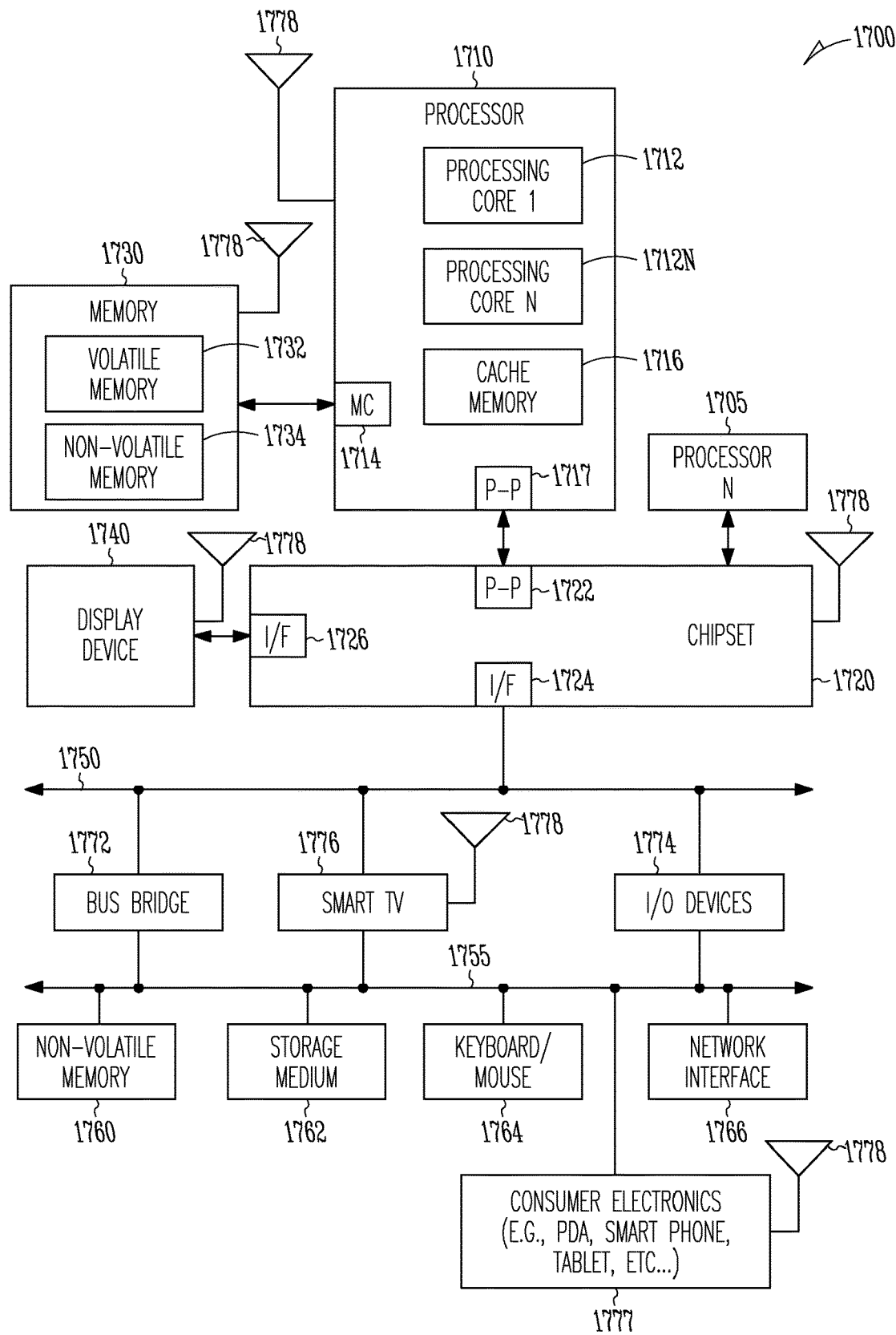
FIG. 17 illustrates a system level diagram, depicting an example of an electronic device (e.g., system) including the first electronic interconnect, the second electronic interconnect, the third electronic interconnect, the fourth electronic interconnect, and/or the first electronic system as described in the present disclosure.

FIG. 17 illustrates a system level diagram, depicting an example of an electronic device (e.g., system) including the first electronic interconnect 100, the second electronic interconnect 300, the third electronic interconnect 700, the fourth electronic interconnect 1100, and/or the first electronic system 1500 as described in the present disclosure. FIG. 17 is included to show an example of a higher level device application for the first electronic interconnect 100, the second electronic interconnect 300, the third electronic interconnect 700, the fourth electronic interconnect 1100, and/or the first electronic system 1500.

In one embodiment, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1700 is a system on a chip (SOC) system.

In one embodiment, processor 1710 has one or more processor cores 1712 and 1712N, where 1712N represents the Nth processor core inside processor 1710 where N is a positive integer. In one embodiment, system 1700 includes multiple processors including 1710 and 1705, where processor 1705 has logic similar or identical to the logic of processor 1710. In some embodiments, processing core 1712 includes, but is not limited to, pre-fetch logic to fetch instructions, decode logic to decode the instructions, execution logic to execute instructions and the like. In some embodiments, processor 1710 has a cache memory 1716 to cache instructions and/or data for system 1700. Cache memory 1716 may be organized into a hierarchal structure including one or more levels of cache memory.

In some embodiments, processor 1710 includes a memory controller 1714, which is operable to perform functions that enable the processor 1710 to access and communicate with memory 1730 that includes a volatile memory 1732 and/or a non-volatile memory 1734. In some embodiments, processor 1710 is coupled with memory 1730 and chipset 1720. Processor 1710 may also be coupled to a wireless antenna 1778 to communicate with any device configured to transmit and/or receive wireless signals. In one embodiment, an interface for wireless antenna 1778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one embodiment, memory 1730 may also store temporary variables or other intermediate information while processor 1710 is executing instructions. In the illustrated embodiment, chipset 1720 connects with processor 1710 via Point-to-Point (PtP or P-P) interfaces 1717 and 1722. Chipset 1720 enables processor 1710 to connect to other elements in system 1700. In some embodiments of the example system, interfaces 1717 and 1722 operate in accordance with a PtP communication protocol such as the Intel® QuickPath Interconnect (QPI) or the like. In other embodiments, a different interconnect may be used.

In some embodiments, chipset 1720 is operable to communicate with processor 1710, 1705N, display device 1740, and other devices, including a bus bridge 1772, a smart TV 1776, I/O devices 1774, nonvolatile memory 1760, a storage medium (such as one or more mass storage devices) 1762, a keyboard/mouse 1764, a network interface 1766, and various forms of consumer electronics 1777 (such as a PDA, smart phone, tablet etc.), etc. In one embodiment, chipset 1720 couples with these devices through an interface 1724. Chipset 1720 may also be coupled to a wireless antenna 1778 to communicate with any device configured to transmit and/or receive wireless signals.

Chipset 1720 connects to display device 1740 via interface 1726. Display 1740 may be, for example, a liquid crystal display (LCD), a plasma display, cathode ray tube (CRT) display, or any other form of visual display device. In some embodiments of the example system, processor 1710 and chipset 1720 are merged into a single SOC. In addition, chipset 1720 connects to one or more buses 1750 and 1755 that interconnect various system elements, such as I/O devices 1774, nonvolatile memory 1760, storage medium 1762, a keyboard/mouse 1764, and network interface 1766. Buses 1750 and 1755 may be interconnected together via a bus bridge 1772.

In one embodiment, mass storage device 1762 includes, but is not limited to, a solid state drive, a hard disk drive, a universal serial bus flash memory drive, or any other form of computer data storage medium. In one embodiment, network interface 1766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) can be incorporated into processor core 1712.

Figure 18:
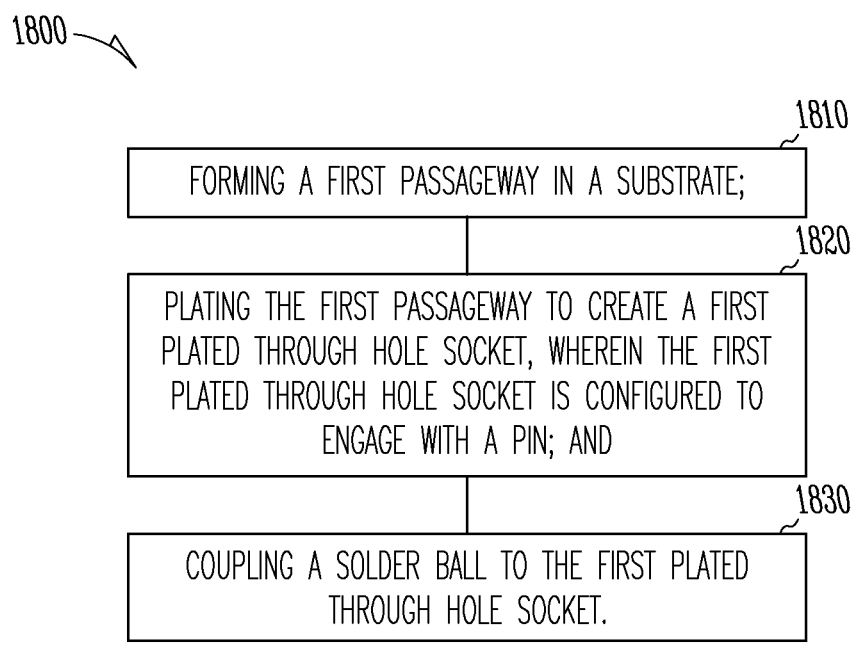
FIG. 18 shows one example of a method for manufacturing an electronic device, including one or more of the electronic interconnects as described herein.

FIG. 18 shows one example of a method 1800 for manufacturing an electronic device, including one or more of the electronic interconnects as described herein. In describing the method 1800, reference is made to one or more components, features, functions and steps previously described herein. Where convenient, reference is made to the components, features, steps and the like with reference numerals. The reference numerals provided are exemplary and are not exclusive. For instance, components, features, functions, steps and the like described in the method 1800 include, but are not limited to, the corresponding numbered elements provided herein and other corresponding elements described herein (both numbered and unnumbered) as well as their equivalents.

At operation 1810, a first passageway may be formed in a substrate. A conductive layer may be coupled to the substrate. Forming the first passageway in the substrate may include energizing a laser configured to remove a portion of the substrate. Forming the first passageway in the substrate may additionally include that the laser is utilized to remove the portion of the substrate in communication with the conductive layer. Forming the first passageway in the substrate may include deenergizing the laser when the laser is in communication with the conductive layer.

At operation 1820, the first passageway may be plated to create a first plated through hole socket, such as the socket 140 shown in FIG. 1. The first plated through hole socket may be configured to engage with a pin. The method 1800 may include engaging the pin with the plated through hole socket.

At operation 1830, a solder ball may be coupled to the first plated through hole socket. Several options for the method 1800 follow. A contact including the pin may be coupled with an integrated circuit. A portion of the contact may be coupled with a dielectric layer. A solder material may be placed in the plated through hole socket.

VARIOUS NOTES AND EXAMPLES

Aspect 1 may include or use subject matter (such as an apparatus, a system, a device, a method, a means for performing acts, or a device readable medium including instructions that, when performed by the device, may cause the device to perform acts), such as may include or use an electronic interconnect. The electronic interconnect may include a substrate. The substrate may include a passageway in the substrate. The passageway may extend from a first surface of the substrate toward a second surface of the substrate. The passageway may be closed at an end of the passageway.

The electronic interconnect may include a plated through hole socket. The plated through hole socket may be coupled to the passageway. The electronic interconnect may include a contact. The contact may include a pin. The pin may be configured to engage with the plated through hole socket. The electronic interconnect may include a solder ball. The solder ball may be coupled to the plated through hole socket.

Aspect 2 may include or use, or may optionally be combined with the subject matter of Aspect 1, to optionally include or use a conductive layer. The conductive layer may be coupled to the second surface of the substrate. The conductive layer may close the end of passageway.

Aspect 3 may include or use, or may optionally be combined with the subject matter of one or any combination of Aspects 1 or 2 to optionally include or use that the solder ball closes the end of the passageway.

Aspect 4 may include or use, or may optionally be combined with the subject matter of one or any combination of Aspects 1 through 3 to optionally include or use that the contact may be positioned on a first side of the substrate. The solder ball may be positioned on a second side of the substrate. The first side of the substrate may be opposite the second side of the substrate.

Aspect 5 may include or use, or may optionally be combined with the subject matter of one or any combination of Aspects 1 through 4 to optionally include or use that the pin may extend into the plated through hole socket.

Aspect 6 may include or use, or may optionally be combined with the subject matter of one or any combination of Aspects 1 through 5 to optionally include or use that the plated through hole socket may include a conductive layer coupled to the passageway.

Aspect 7 may include or use, or may optionally be combined with the subject matter of Aspect 6 to optionally include or use that the conductive layer may be plated onto the passageway.

Aspect 8 may include or use, or may optionally be combined with the subject matter of one or any combination of Aspects 1 through 7 to optionally include or use that a first portion of the plated through hole socket may be coupled to the first surface. A second portion of the plated through hole socket may be coupled to the second surface. The first portion of the plated through hole socket and the second portion of the plated through hole socket may extend beyond the passageway.

Aspect 9 may include or use, or may optionally be combined with the subject matter of one or any combination of Aspects 1 through 8 to optionally include or use at least one contact leg. The contact leg may be coupled to the first side of the substrate in a region surrounding the passageway.

Aspect 10 may include or use, or may optionally be combined with the subject matter of one or any combination of Aspects 1 through 9 to optionally include or use a dielectric layer. The dielectric layer may form a direct interface with a portion of the plated through hole socket. The dielectric layer may form a direct interface with a portion of the substrate.

Aspect 11 may include or use, or may optionally be combined with the subject matter of one or any combination of Aspects 1 through 10 to optionally include or use a socket core. The socket core may include a dielectric material. The socket core may be coupled to a conductive liner.

Aspect 12 may include or use, or may optionally be combined with the subject matter of one or any combination of Aspects 1 through 11 to optionally include or use a socket pad. The solder ball may be coupled to the plated through hole socket at the socket pad.

Aspect 13 may include or use, or may optionally be combined with the subject matter of one or any combination of Aspects 1 through 12 to optionally include or use a solder material. The solder material may form a direct interface with the plated through hole socket and the pin.

Aspect 14 may include or use subject matter (such as an apparatus, a system, a device, a method, a means for performing acts, or a device readable medium including instructions that, when performed by the device, may cause the device to perform acts), such as may include or use an electronic system.

The electronic system may include a substrate. The substrate may include a first passageway. The substrate may include a second passageway. The first passageway may extend from a first surface of the substrate toward a second surface of the substrate. The second passageway may extend from a first surface of the substrate toward a second surface of the substrate. The first passageway may be closed at an end of the first passageway. The first passageway may be closed at an end of the first passageway.

The electronic system may include a first plated through hole socket. The first plated through hole socket may be coupled to the first passageway. The electronic system may include a second plated through hole socket coupled to the second passageway. The electronic system may include a first contact. The first contact may include a first pin. The first pin may be configured to engage with the first plated through hole socket. The electronic system may include a second contact. The second contact may include a second pin. The second pin may be configured to engage with the second plated through hole socket.

The electronic system may include a first solder ball. The first solder ball may be in electrical communication with the first contact. The first solder ball may be coupled to the first socket. The electronic system may include a second solder ball. The second solder ball may be in electrical communication with the second contact. The second solder ball may be coupled to the second socket.

Aspect 15 may include or use, or may optionally be combined with the subject matter of Aspect 14, to optionally include or use that the first plated through hole socket may be spaced from the second plated through hole socket at a first pitch.

Aspect 16 may include or use, or may optionally be combined with the subject matter of Aspect 15 to optionally include or use that the first solder ball may be spaced from the second solder ball at the first pitch.

Aspect 17 may include or use, or may optionally be combined with the subject matter of one or any combination of Aspects 15 or 16 to optionally include or use that the first pitch spacing may be one millimeter or less than one millimeter.

Aspect 18 may include or use, or may optionally be combined with the subject matter of one or any combination of Aspects 14 through 17 to optionally include or use a plurality of sockets. The plurality of sockets may include the first plated through hole socket and the second plated through hole socket. The electronic system may include a plurality of solder balls. The plurality of solder balls may include the first solder ball and the second solder ball. The plurality of sockets may be arranged in a pin grid array. The plurality of solder balls may be arranged in a ball grid array.

Aspect 19 may include or use, or may optionally be combined with the subject matter of one or any combination of Aspects 14 through 18 to optionally include or use that the first plated through hole socket may be spaced from the second plated through hole socket at a second pitch.

Aspect 20 may include or use, or may optionally be combined with the subject matter of one or any combination of Aspects 14 through 19 to optionally include or use a plurality of plated through hole sockets. The plurality of plated through hole sockets may include the first plated through hole socket and the second plated through hole socket.

Aspect 21 may include or use, or may optionally be combined with the subject matter of Aspect 20 to optionally include or use that the plurality of plated through hole sockets may be arranged in an array.

Aspect 22 may include or use, or may optionally be combined with the subject matter of one or any combination of Aspects 14 through 21 to optionally include or use an integrated circuit. The integrated circuit may be coupled to the first contact. The first integrated circuit may be coupled to the second contact. The first solder ball may be in electrical communication with the integrated circuit. The second solder ball may be in electrical communication with the integrated circuit.

Aspect 23 may include or use subject matter (such as an apparatus, a system, a device, a method, a means for performing acts, or a device readable medium including instructions that, when performed by the device, may cause the device to perform acts), such as may include or use a method for manufacturing an electronic device. The method may include forming a first passageway in a substrate. The method may include plating the first passageway to create a first plated through hole socket. The first plated through hole socket may be configured to engage with a pin. The method may include coupling a solder ball to the first plated through hole socket.

Aspect 24 may include or use, or may optionally be combined with the subject matter of Aspect 23, to optionally include or use that forming the first passageway in the substrate may include energizing a laser. The laser may be configured to remove a portion of the substrate.

Aspect 25 may include or use, or may optionally be combined with the subject matter of Aspect 24 to optionally include or use a conductive layer. The conductive layer may be coupled to substrate. The laser may be utilized to remove the portion of the substrate in communication with the conductive layer.

Aspect 26 may include or use, or may optionally be combined with the subject matter of Aspect 25 to optionally include or use that the method may include deenergizing the laser. The laser may be deenergized, or reflected, when the laser is in communication with the conductive layer.

Aspect 27 may include or use, or may optionally be combined with the subject matter of one or any combination of Aspects 23 through 26 to optionally include or use that the method may include engaging the pin with the plated through hole socket.

Aspect 28 may include or use, or may optionally be combined with the subject matter one or any combination of Aspects 23 through 27 to optionally include or use that the method may include coupling a contact that includes the pin with an integrated circuit.

Aspect 29 may include or use, or may optionally be combined with the subject matter of Aspect 28 to optionally include or use that the method may include coupling a portion of the contact with a dielectric layer.

Aspect 30 may include or use, or may optionally be combined with the subject matter of one or any combination of Aspects 23 through 29 to optionally include or use that the method may include placing a solder material in the plated through hole socket.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic interconnect, comprising:
   a substrate, including a passageway in the substrate, wherein:
      the passageway extends from a first surface of the substrate toward a second surface of the substrate, and
      the passageway is closed at an end of the passageway;
   a conductive layer coupled to the second surface of the substrate, wherein the conductive layer closes the end of the passageway;
   a plated through hole socket coupled to the passageway, wherein the plated through hole socket includes a first end and a second end;
   a contact, including a pin, wherein the pin is configured to be received in the first end of the plated through hole socket and the pin is configured to engage with the plated through hole socket; and
   a solder ball coupled to the second end of the plated through hole socket.

2. The electronic interconnect of claim 1, wherein the pin is spaced from the solder ball and the pin is in electrical communication with the solder ball through the plated through hole socket.

3. The electronic interconnect of claim 1, wherein the contact is positioned proximate the first end of the plated through hole socket.

4. The electronic interconnect of claim 1, wherein the pin is received in the first end of the plated through hole socket.

5. The electronic interconnect of claim 1, wherein the conductive layer is plated onto the second surface of the substrate.

6. The electronic interconnect of claim 1, wherein:
   a first portion of the plated through hole socket is coupled to the first surface and a second portion of the plated through hole socket is coupled to the second surface, and
   the first portion of the plated through hole socket and the second portion of the plated through hole socket extend beyond the passageway.

7. The electronic interconnect of claim 1, further comprising a dielectric layer, wherein the dielectric layer forms a direct interface with a portion of the plated through hole socket and a portion of the substrate.

8. The electronic interconnect of claim 1, further comprising a socket core, wherein the socket core includes a dielectric material and the socket core is coupled to a conductive liner.

9. The electronic interconnect of claim 1, further comprising a solder material forming a direct interface with the plated through hole socket and the pin.

10. An electronic system, comprising:
    a substrate including a first passageway and a second passageway, wherein:
       the first passageway and the second passageway extend from a first surface of the substrate toward a second surface of the substrate, and
       the first passageway is closed at an end of the first passageway;
    a conductive layer coupled to the second surface of the substrate, wherein the conductive layer closes the end of the first passageway;
    a first plated through hole socket coupled to the first passageway, wherein the first plated through hole socket includes a first end and a second end;
    a second plated through hole socket coupled to the second passageway;
    a first contact, including a first pin, wherein the first pin is configured to be received in the first end of the first plated through hole socket and the first pin is configured to engage with the first plated through hole socket;
    a second contact, including a second pin, wherein the second pin is configured to engage with the second plated through hole socket;
    a first solder ball in electrical communication with the first contact, wherein the first solder ball is coupled to the second end of the first plated through hole socket; and
    a second solder ball in electrical communication with the second contact, wherein the second solder ball is coupled to the second plated through hole socket.

11. The electronic system of claim 10, further comprising an integrated circuit coupled to the first contact and the second contact, wherein the first solder ball and the second solder ball are in electrical communication with the integrated circuit.

12. The electronic system of claim 10, wherein the first plated through hole socket is spaced from the second plated through hole socket at a first pitch.

13. The electronic system of claim 12, wherein the first solder ball is spaced from the second solder ball at the first pitch.

14. The electronic system of claim 12, wherein the first pitch spacing is one millimeter or less than one millimeter.

15. The electronic system of claim 10, wherein the first plated through hole socket and the second plated through hole socket are included in a plurality of through hole sockets.

16. The electronic system of claim 15, wherein the plurality of plated through hole sockets are arranged in an array.

17. A method for manufacturing an electronic device, comprising:
    forming a first passageway in a substrate, wherein the first passageway is closed at an end of the first passageway;
    coupling a conductive layer to a surface of the substrate, wherein the conductive layer closes the end of the passageway;
    plating the first passageway to create a first plated through hole socket, wherein the first plated through hole socket includes a first end and a second end and the first end of the first plated through hole socket is configured to receive a pin, and the pin is configured to engage with the first plated through hole socket; and coupling a solder ball to the second end of the first plated through hole socket.

18. The method of claim 17, further comprising engaging the pin with the first plated through hole socket.

19. The method of claim 17, coupling a contact that includes the pin with an integrated circuit.

20. The method of claim 17, further comprising placing a solder material in the plated through hole socket.

21. The method of claim 17, wherein forming the first passageway in the substrate includes energizing a laser configured to remove a portion of the substrate.

22. The method of claim 21, further comprising removing a portion of the substrate in communication with the conductive layer with a laser.

23. The method of claim 22, further comprising deenergizing the laser when the laser is in communication with the conductive layer.

* * * * *